(12) United States Patent
Glas

(10) Patent No.: US 6,330,290 B1
(45) Date of Patent: Dec. 11, 2001

(54) DIGITAL I/Q IMBALANCE COMPENSATION

(75) Inventor: Jack P. Glas, Basking Ridge, NJ (US)

(73) Assignee: Lucent Technologies, Inc., NJ (US)

( * ) Notice: Subject to any disclaimer, the term of this patent is extended or adjusted under 35 U.S.C. 154(b) by 0 days.

(21) Appl. No.: 09/161,164

(22) Filed: Sep. 25, 1998

(51) Int. Cl.[7] .................................................. H04B 1/12
(52) U.S. Cl. ...................... 375/324; 375/349; 455/314; 329/306
(58) Field of Search ..................................... 375/219, 271, 375/279, 322, 324, 329, 344; 455/313–315, 317, 318, 323, 324, 334, 337–341, 255–265, 296, 307–312, 115–116, 126; 329/304, 318, 241, 306

(56) References Cited

U.S. PATENT DOCUMENTS

| | | | |
|---|---|---|---|
| 5,705,949 | * 1/1998 | Alelyunas et al. | 329/304 |
| 5,930,286 | * 7/1999 | Walley | 375/200 |
| 6,009,317 | * 12/1999 | Wynn | 455/296 |
| 6,122,325 | * 9/2000 | Morge et al. | 375/261 |

OTHER PUBLICATIONS

M. Banu, H. Wang, M. Seidel, M. Tarsia, W. Fisher, J. Glas, A. Dec, and V. Buccuzzi. A bicmos double–low–if receiver for gsm. In Proceedings of the CICC'97, pp. 521–524.IEEE, 1997.

J. Crols and M. Steyaert. An analog integrated polyphase filter for a high performance low–if receiver. In Proc. Of the VLSI Circuits Symposium, pp. 87–88, Jun. 1995.

J. Crols and M. Steyaert. A single–chip 900 MHz cmos receiver front–end with a high performance low–if topology. IEEE Journal of Solid–State Circuits, 30(7):736–742, Jul. 1995.

James K. Cavers. Adaptive compensation for imbalance and offset losses in direct conversion transceivers. IEEE Transactions on Vehicular Technology, 42(4):581–588, Nov. 1993.

I. Koullias et al. A 900 MHz transceiver chip set for dual–mode cellular radio mobile terminals. In International Solid State Circuits Conference Digest of Technical Papers.IEEE, May 1993.

Saeed Navid et al. Level–locked loop, a technique for broadband quadrature signal generation. In proceedings of the Custom Integrated Circuits Conference, pp. 411–414. IEEE, May 1997.

José Páez–Borrallo and Francisco J. Casajús Quirós. Self adjusting digital image rejection receiver for mobile communications. In proceedings of the VTC'97, pp. 686–690, 1997.

Behzad Razavi. Design considerations for direct–conversion receivers. IEEE Transactions on Circuits and Systems II, 44(6):428–435, Jun. 1997.

\* cited by examiner

Primary Examiner—Amanda T. Le

(57) ABSTRACT

In a communications terminal that has an image reject mixing arrangement, a compensation system provides compensation for phase and amplitude imbalances, which are caused by a demodulating local oscillator employed in the communications terminal. The image reject mixing arrangement comprises a radio-frequency (RF) mixing stage including an in-phase and a quadrature phase branch, which is configured to receive a radio frequency signal and down convert the radio frequency signal to in-phase and quadrature phase intermediate frequency (IF) signals. It also includes a phase splitter unit coupled to the radio-frequency (RF) mixing stage and configured to provide an in-phase local oscillator signal and a quadrature phase local oscillator signal to the RF mixing stage. The phase splitter causes an amplitude imbalance signal $\Delta$ and a phase imbalance signal $\phi$ to be generated in the in-phase and quadrature phase branch of the RF mixing stage. A phase splitter compensation unit is coupled to the RF mixing stage and is configured to multiply the in-phase and quadrature phase signals provided by the RF mixing stage by a predetermined compensation factor. An intermediate frequency (IF) mixing stage is coupled to the radio-frequency mixing stage via the phase splitter compensation unit. The IF mixing stage is configured to convert the intermediate signals received from the RF mixing stage to base band frequency region.

29 Claims, 6 Drawing Sheets

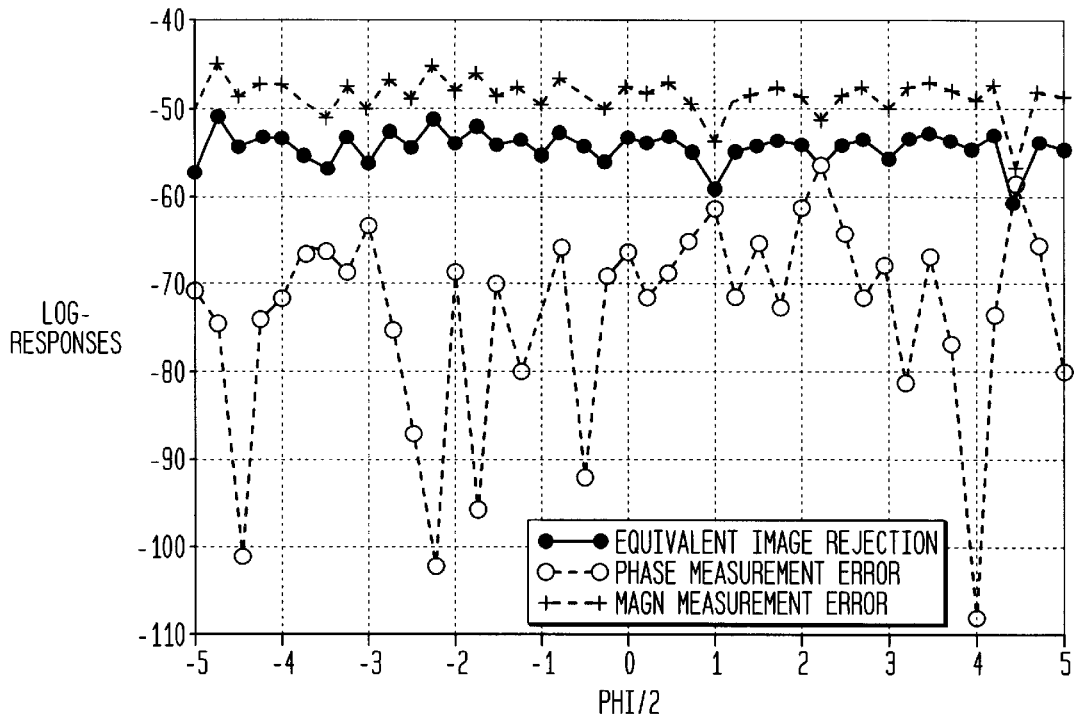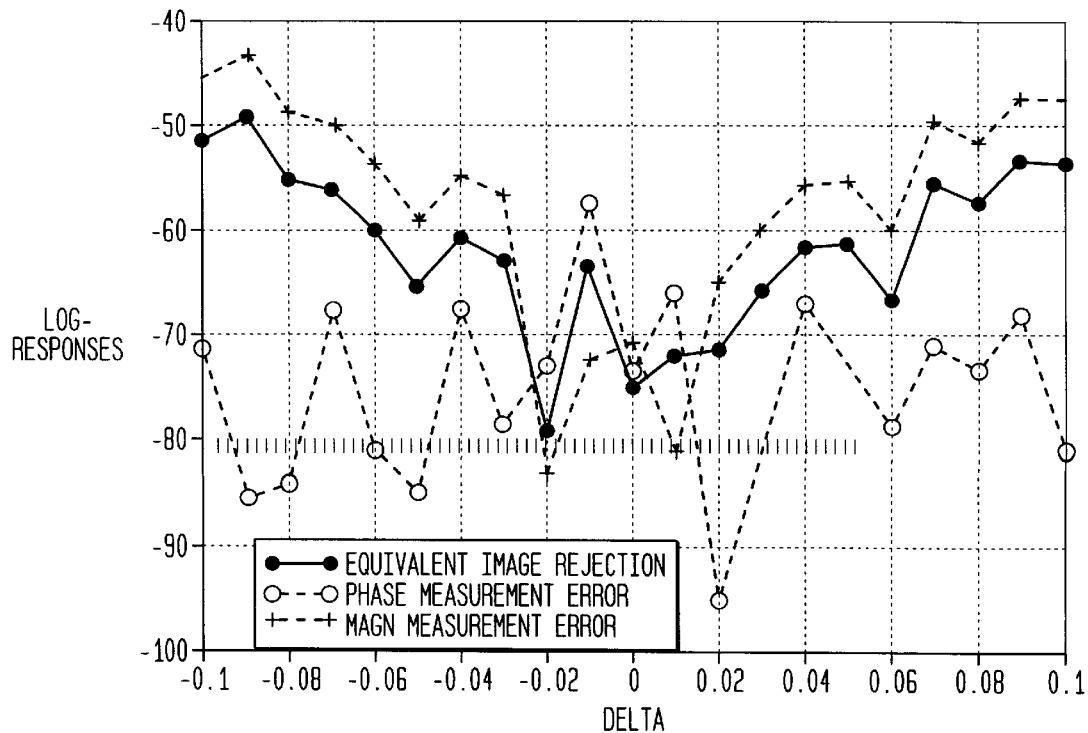

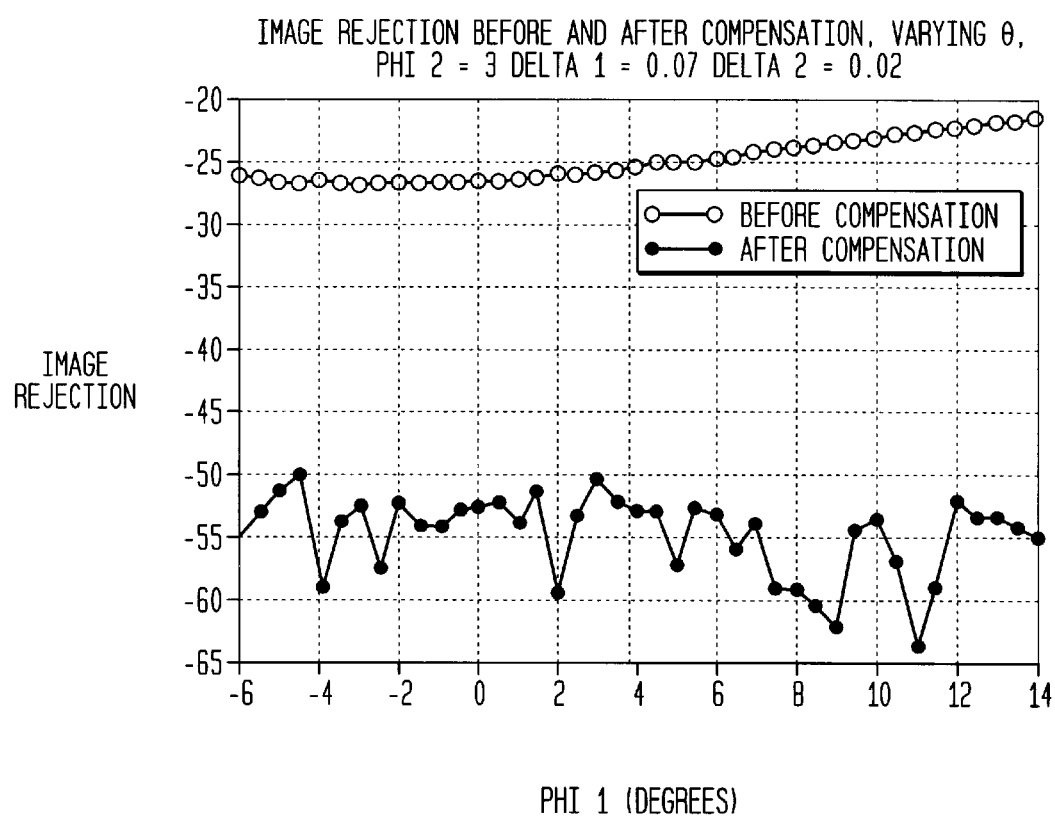

DIGITAL I/Q IMBALANCE COMPENSATION

FIELD OF THE INVENTION

This invention relates to a demodulator and more specifically to an arrangement for compensating I/Q imbalances caused by imbalances in the receive chain of a communication terminal.

BACKGROUND OF THE INVENTION

The need for lower cost transceivers is continuously increasing as the use for wireless communication terminals is expanding at a remarkable rate. Among one of the various designs employed in such terminals is an arrangement that includes a super heterodyne receiver, which includes an image-reject filter at the antenna input. Although this arrangement provides for a good quality reception, it tends to be costly and complicated.

Recently, the super heterodyne receiver has been replaced by a less costly design referred to as a low IF receiver which applies. RF image-reject mixing. RF image-reject mixers avoid the need for image-reject filters at the input and enable conversion of radio-frequencies at a greatly reduced cost.

A disadvantage of RF image-reject mixing designs is signal imbalances that are generated by the signal splitter unit that is coupled to the local oscillator employed for demodulation. FIG. 1 illustrates a typical low-IF receiver 10 that employs an image-reject mixing design. Antenna 12 receives radio-frequency signals that are filtered via low-noise amplifier 14, and fed to a mixing demodulator 18 via low-noise amplifier 16. Mixing demodulator 18 includes an RF mixing stage 30, which functions as an intermediate frequency converter of receiver 10. RF mixing stage 30 is configured as a quadrature demodulator comprising an in-phase and quadrature-phase branches respectively. A local oscillator 60 provides a sinusoidal signal to a signal splitter 20. The output ports of signal splitter 20 provide an in-phase frequency signal and a quadrature frequency signal to each of these branches via mixers 22 and 24 respectively, so as to demodulate and shift the frequency range of the received signal from radio-frequency, such as 900 Mhz to an intermediate range such as 100 Khz. Each branch also includes an automatic gain control and filtering unit 26 and an analog to digital converter 27, so as to provide IF digital signals to a second IF mixing stage 28. The IF mixing stage of demodulator 18 functions as a base band demodulator, which is designed to shift the frequency range of signals provided by first mixing stage to a baseband region.

Intermediate frequency (IF) mixing stage 28 includes an in-phase branch that subdivides into two branches 32 and 34. IF mixing stage 28 also includes a quadrature phase branch that subdivides into two branches 36 and 38. Each branch 32 and 34 includes a mixer 40 and 44 respectively, which are configured to mix the in-phase component received from RF mixing stage 30 with an in-phase and quadrature phase local-oscillator signal received from local oscillator 60 so as to provide baseband in-phase signal I1 and baseband quadrature signal IQ. Similarly, each branch 36 and 38 includes a mixer 42 and 48 respectively, which are configured to mix the quadrature phase component received from RF mixing stage 30 with an in-phase and quadrature phase local-oscillator signal received from local oscillator 60 so as to provide baseband in-phase signal Q1 and baseband quadrature signal QQ.

Adders 52 and 54 are configured to add and subtract various baseband components obtained from second mixing stage as will be discussed later in more detail, so as to provide a signal with substantially small image components. It is noted that the image band component signals are caused by interference from adjacent channels which are mixed into the desired signal band intended for receiver 10 due to imbalances in the I/Q paths. The output signal of adders 52 and 54 are then provided to a digital signal processing 56 via digital filters 58 and 60 respectively.

As mentioned above, a significant disadvantage with receiver 10 is the need for extremely accurate splitter unit for the local oscillator to achieve the desired image rejection. Thus, it is important for such receivers that the in-phase and the quadrature phase components of the RF local oscillator 20 are exactly in quadrature and have equal amplitudes. Any phase or amplitude imbalances may directly decrease the image-reject capabilities of the receiver.

A common way to acquire the quadrature signal is by using a RC-CR circuit. When these circuits are employed in an integrated circuit (IC) arrangement, a desired tolerance may not be achieved resulting in a worse than acceptable image rejection. Some designs include poly-phase filters to generate accurate quadrature signals. However, such filters consume relatively high power.

Thus, there is a need for a receiver that provides accurate demodulation with substantially low image band components.

SUMMARY OF THE INVENTION

In accordance with one embodiment of the invention a communications receiver provides a compensation arrangement that overcomes the phase and amplitude imbalances caused by the local oscillator employed in the receiver. The receiver includes a first RF mixing stage and a second IF mixing stage. The RF mixing stage includes an in-phase and a quadrature phase branch respectively that provide IF demodulated signals to the IF mixing stage via a phase splitter compensator unit. In accordance with one embodiment, the phase splitter compensator unit multiplies the in-phase and quadrature phase signals provided by the RF mixing stage by a predetermined compensation factor that among other things depend on the amplitude and phase imbalances caused by the local oscillator in the RF mixing stage.

During operation, a test tone signal is generated and provided to the receiver. Both desired and image band signals are measured and based on those measurements the value of the compensation factors are derived. The test tone signal may be generated externally at the fabrication stage of the receiver. Alternatively, the receiver may also generate a test tone to periodically adjust the compensation factor as it becomes necessary.

BRIEF DESCRIPTION OF THE DRAWINGS

FIGS. 5–8 are plots illustrating simulation results of receiver characteristics in accordance with the present invention.

DETAILED DESCRIPTION OF THE INVENTION

Figure 1:
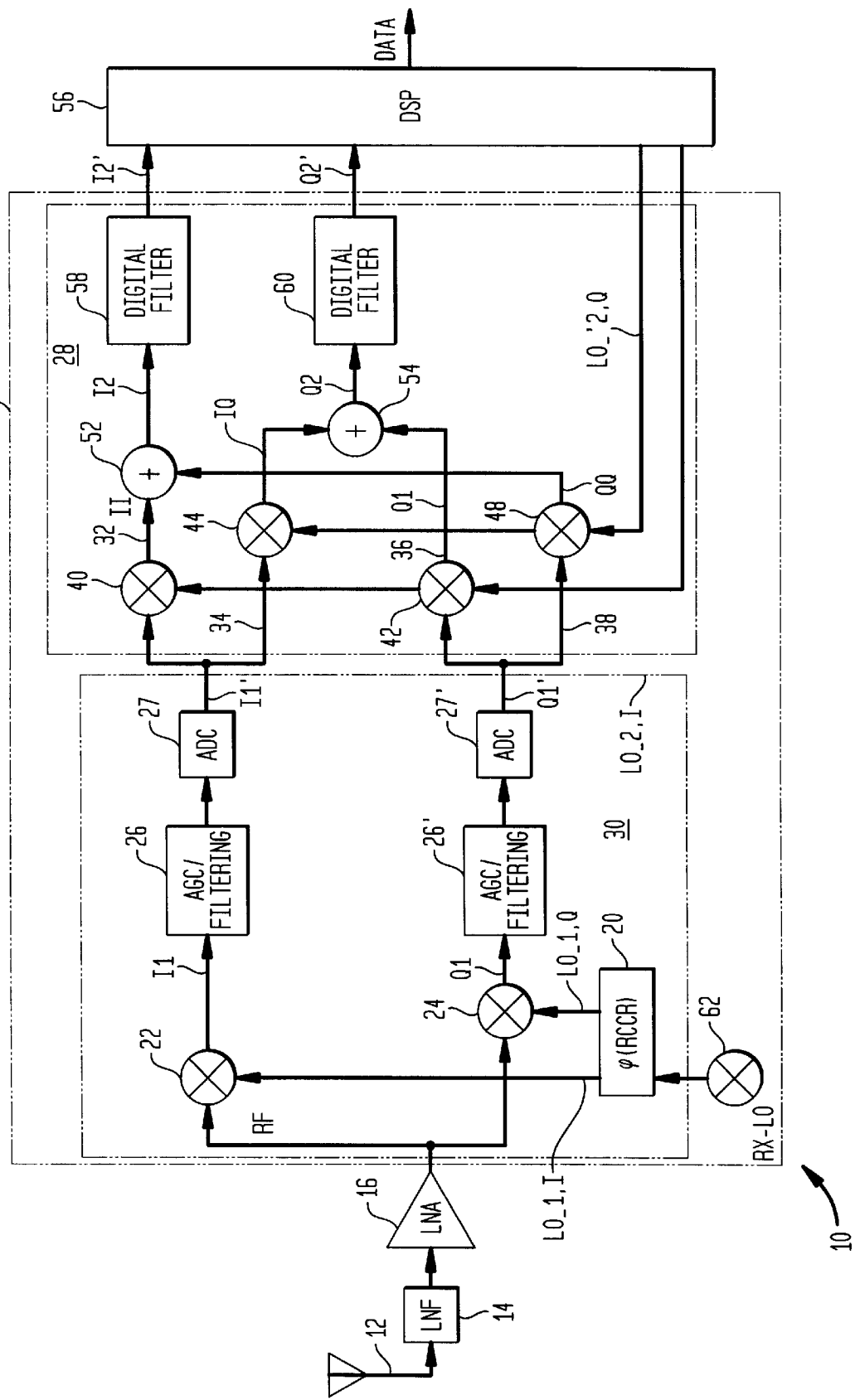
FIG. 1 is a block diagram of a prior art receiver employing an image-reject mixing arrangement.

In accordance with one embodiment of the invention, the image rejection properties of receiver 10 is obtained so as to provide accurate compensation for imbalances caused by splitter unit 20 as explained above in the background.

The input radio-frequency (RF) signal to antenna 12 is:

$$rf(t) = A\cos((\omega_1+\omega_d)t+\theta(t)) \quad (1)$$

wherein A is the amplitude of the carrier frequency, $\omega_1$ is the carrier frequency, $\omega_d$ is the intermediate frequency (IF), $\theta(t)$ is the modulated desired signal with a constant phase offset. The in-phase and quadrature phase local-oscillator signals with their inaccuracies caused by splitter unit 20 are:

$$LO_{1,I} = (1+\Delta_1)\cos(\omega_1 t+\phi_1) \quad (2a)$$

$$LO_{1,Q} = (1-\Delta_2)\sin(\omega_1 t-\phi_2) \quad (2b)$$

wherein $\Delta$ represents amplitude imbalance and $\phi$ represents phase imbalance of signals provided by splitter unit 20.

Assuming that the amplitude and phase imbalance are unrelated, the total inaccuracies are represented as:

$$\Delta_{total} = \Delta_1 + \Delta_2 \quad (3a)$$

$$\phi_{total} = \phi_1 + \phi_2 \quad (3b)$$

The signal components provided by the output ports of mixers 22 and 24, at the RF mixing stage 30 include an in-phase radio-frequency signal $I_1$, and a quadrature phase radio-frequency signal $Q_I$, and, may be represented as:

$$I_1 = \frac{A(1+\Delta_1)}{2}[\cos(\omega_d t+\theta-\phi_1) + \cos((2\omega_1+\omega_d)t+\theta+\phi_1)] \quad (4a)$$

and $$Q_1 = \frac{-A(1-\Delta_2)}{2}[\sin(\omega_d t+\theta+\phi_2) - \sin((2\omega_1+\omega_d)t+\theta-\phi_2)] \quad (4b)$$

The in-phase signal $I_1$ and quadrature phase signal $Q_1$ after passing through filtering units 26 may be represented as filtered in-phase signal $I'_1$ and filtered quadrature phase signal $Q'_1$:

$$I'_1 = \frac{A}{2}(1+\Delta_1)\cos(\omega_d t+\theta-\phi_1) \quad (5a)$$

and $$Q'_1 = -\frac{A}{2}(1-\Delta_2)\sin(\omega_d t+\theta+\phi_2) \quad (5b)$$

Both filtered in-phase signal and quadrature phase signal are converted into the digital domain via analog to digital converters 27 and mixed with a local oscillator signal at mixers 40, 42, 44 and 46, so as to convert the signals into baseband region. The local oscillator signals provided to mixers 40 through 46 are:

$$LO_{2,I} = \cos(\omega_d t) \quad (6a)$$

$$LO_{2,Q} = \sin(\omega_d t) \quad (6b)$$

Because the frequency conversion in IF mixing stage 28 takes place in the digital domain, inaccuracies caused by local oscillator unit are much smaller than those caused by the RF mixing stage and can be neglected. Mixers 40, 42, 44 and 46 generate the following signals:

$$II = I'_1 \cdot LO_{2,I} \quad (7a)$$
$$= \frac{A(1+\Delta_1)}{4}[\cos(\theta-\phi_1) + \cos(2\omega_d t+\theta-\phi_1)]$$

$$IQ = I'_1 \cdot LO_{2,Q} \quad (7b)$$
$$= \frac{-A(1+\Delta_1)}{4}[\sin(\theta-\phi_1) - \sin(2\omega_d t+\theta-\phi_1)]$$

$$QI = Q'_1 \cdot LO_{2,I} \quad (7c)$$
$$= \frac{-A(1-\Delta_2)}{4}[\sin(\theta+\phi_2) + \sin(2\omega_d t+\theta+\phi_2)]$$

and $$QQ = Q'_1 \cdot LO_{2,Q} \quad (7d)$$
$$= \frac{-A(1-\Delta_2)}{4}[\cos(\theta+\phi_2) - \cos(2\omega_d t+\theta+\phi_2)]$$

The in-phase component of the desired signal can be obtained by subtracting signal QQ from signal II, while the quadrature component of the desired signal can be obtained by adding QI signal to IQ signal. The in-phase and quadrature phase components of the image band signal is obtained by performing the opposite operations. Thus, the in-phase component of the image signal can be obtained by adding signals QQ to signal II, while the quadrature component of the image signal can be obtained by subtracting QI signal from IQ signal as follows:

$$I_2 = II - QQ \quad (8a)$$

$$Q_2 = IQ + QI \quad (8b)$$

$$I_{2\,image} = II + QQ \quad (8c)$$

$$Q_{2\,image} = IQ - QI \quad (8d)$$

As explained above, the image band component is the unwanted response caused by adjacent channel interference in the desired frequency band. It is noticed that during "calibration" no signals from the antenna are received so this "image frequency" does not contain a signal from an adjacent channel. All image signals are then generated due to the imbalances. During normal operation the adjacent channels (+/−200 kHz) will fall on top of the wanted signal due to these imbalances and so create distortion. As a result, the image-rejection factor can be calculated by dividing the power of the desired signal ($I_2$ and $Q_2$) by the power in the image signal ($I_{2\,image}$ and $Q_{2\,image}$). After adding and subtracting by adders 52 and 54 as explained by equations 8a through 8d, the signals are provided to digital filters 58 and 60 so as to suppress the double frequency terms in equations 7(a) through 7(d), resulting in:

$$I'_2 = \frac{A}{4}[(1+\Delta_1)\cos(\theta-\phi_1) + (1-\Delta_2)\cos(\theta+\phi_2)] \quad (9a)$$

$$Q'_2 = -\frac{A}{4}[(1+\Delta_1)\sin(\theta-\phi_1) + (1-\Delta_2)\sin(\theta+\phi_2)] \quad (9b)$$

$$I'_{2image} = \frac{A}{4}[(1+\Delta_1)\cos(\theta-\phi_1) - (1-\Delta_2)\cos(\theta+\phi_2)] \quad (9c)$$

and $$Q'_{2image} = -\frac{A}{4}[(1+\Delta_1)\sin(\theta-\phi_1) + (1-\Delta_2)\sin(\theta+\phi_2)] \quad (9d)$$

In order to obtain the powers of the desired signal and the image signal, the in-phase and quadrature phase components are squared and summed:

$$P = \frac{A^2}{16}\Big[4(1+\Delta_1-\Delta_2)\cos^2\Big(\frac{\phi_1+\phi_2}{2}\Big)+\Delta_1^2+\Delta_2^2 - \qquad (10a)$$
$$2\Delta_1\Delta_2\cos(\phi_1+\phi_2)\Big]$$

and $$P_{image} = \frac{A^2}{16}\Big[4(1+\Delta_1-\Delta_2)\sin^2\Big(\frac{\phi_1+\phi_2}{2}\Big)+\Delta_1^1+\Delta_2^2 + \qquad (10b)$$
$$2\Delta_1\Delta_2\cos(\phi_1+\phi_2)\Big]$$

For small values of $\phi$ and $\Delta$ the approximations $$(1+\Delta_1-\Delta_2)\approx 1 \qquad (11a)$$

$$\Delta_1\Delta_2 \cos(\phi_1+\phi_2)\approx \Delta_1\Delta_2 \qquad (11b)$$

are acceptable. Thus, the powers of the desired and the image signals are:

$$P = \frac{A^2}{16}\Big[4\cos^2\Big(\frac{\phi_1+\phi_2}{2}\Big)+(\Delta_1-\Delta_2)^2\Big] \qquad (12a)$$

and $$P_{image} = \frac{A^2}{16}\Big[4\sin^2\Big(\frac{\phi_1+\phi_2}{2}\Big)+(\Delta_1+\Delta_2)^2\Big] \qquad (12b)$$

and the image rejection ratio is:

$$\frac{P_{image}}{P} \approx \sin^2\Big(\frac{\phi_1+\phi_2}{2}\Big)+\Big(\frac{\Delta_1+\Delta_2}{4}\Big)^2 \qquad (13a)$$
$$= \sin^2\Big(\frac{\phi_{total}}{2}\Big)+\frac{\Delta_{total}^2}{4}$$

Figure 2:
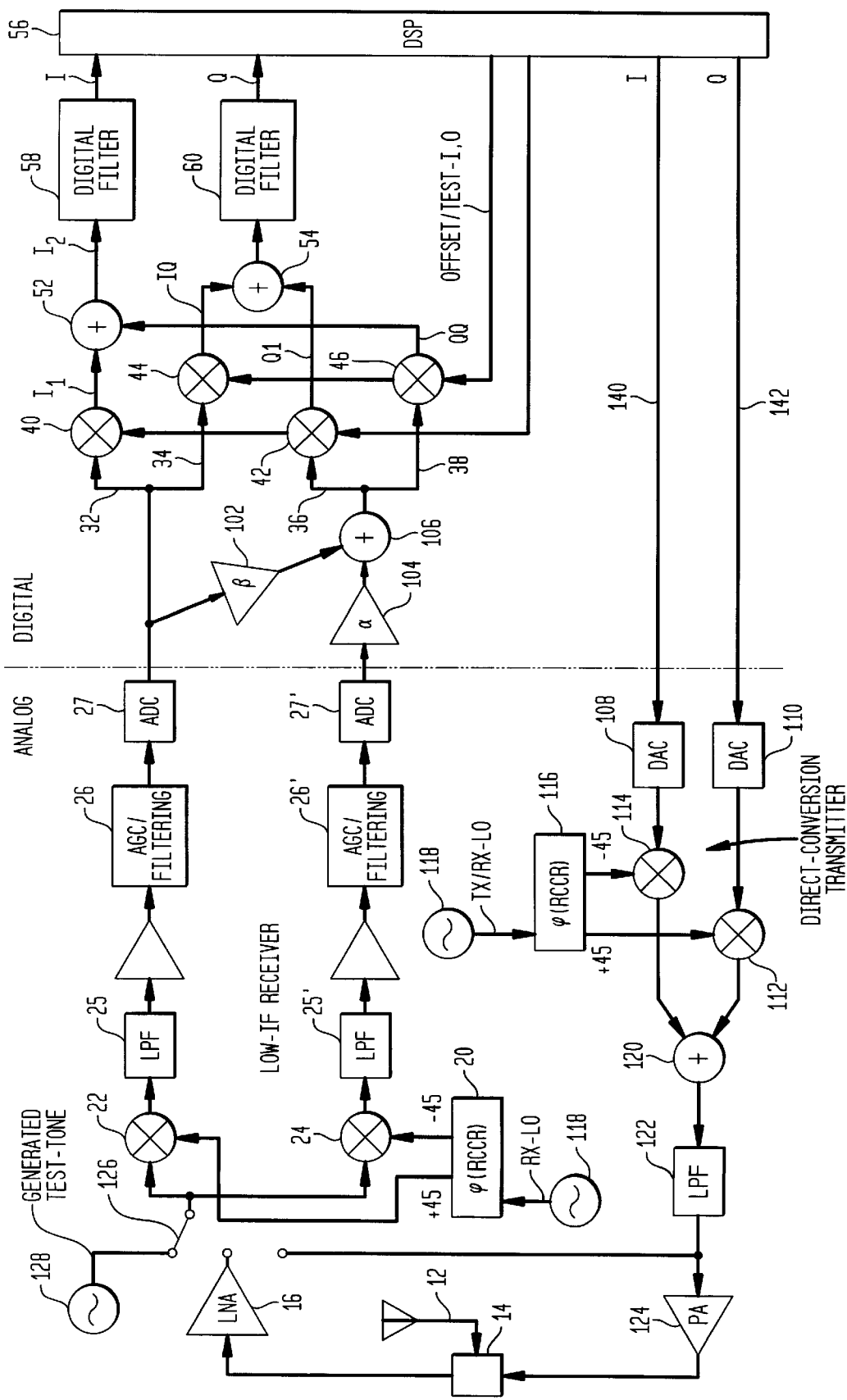
FIG. 2 is a block diagram of a receiver in accordance with one embodiment of the present invention.

FIG. 2 illustrates a block diagram of a transceiver 10 in accordance with one embodiment of the present invention. Antenna 12 is coupled to a low noise filter 14, which in turn is coupled to a low noise amplifier 16. A switch 126 is configured to switch between the output port of low noise amplifier 16, the output port of an external test-tone generator 128 and the output port of low pass filter 122. Switch 126 is coupled to the receiving branch of transceiver 10 as explained in reference with FIG. 1. Thus, RF mixing stage 30 provides filtering of in-phase and quadrature phase IF signals via filters 25' and 26' and converts the signals to digital domain via analog to digital converters 27 and 27'.

The output port of analog-to-digital A-D converter 27 coupled to the in-phase branches 32 and 34 of IF mixing stage 28. It is also coupled to an input port of compensating unit 102, which is configured to multiply the output signal provided by A-D converter 27 by a factor β. The output port of compensating unit 102 is coupled to an input port of an adder 106. The output port of analog-to-digital (A-D) converter 27' is coupled to an input port of compensating unit 104, which is configured to multiply the output signal provided by A-D converter 27' by a factor α. The output port of compensating unit 104 is coupled to a second input port of adder 106. The output port of adder 106 is coupled to quadrature phase branches 36 and 38 of IF mixing stage 28.

Digital signal processor 56 provides the signals that are transmitted by transceiver 10 via transmitting branches 140 and 142. Specifically, an output port of digital signal processor 56 is coupled to an input port of a digital-to-analog (D-A) converter 108 so as to provide in-phase component of transmitting signal via branch 140. Another output port of digital signal processor 56 is coupled to an input port of a digital-to-analog (D-A) converter 110 so as to provide the quadrature phase component of transmitting signal via branch 142. Output ports of D-A converters 108 and 110 are coupled to input ports of mixers 114 and 112 respectively.

A local oscillator 118 is coupled to another input port of mixers 114 and 112 respectively via a splitter unit 116. Splitter unit 116 provides in-phase and quadrature phase signals. The output port of mixers 114 and 112 are coupled to an adder 120, which in turn provides the transmitting signal in the RF frequency region to a low pass filter 122. The output port of low pass filter 122 is coupled to an input port of a power amplifier 124, which in turn is coupled to antenna 12 via low noise filter 14.

During calibration, test tone signal generator 128 is coupled to transceiver 10 via switch 126, when it is desired to calibrate the transceiver for proper compensation by employing an external test tone. Once the test tone is fed into the receiving section of transceiver 10 the signal is demodulated in the usual way. However, in the digital IF mixing stage, digital signal processor 56 measures both desired and image signals.

It is noted that the image signal is likely to be much smaller than the desired signal. As a result, A-D converters 28 and 28' are configured to cover the dynamic range between the image signal and the desired signal. However, that is always the case as once the image signal is not measurable then it does not influence the bit error rate of transceiver 10.

In order to estimate the imbalance caused by splitter 20, the compensation factors $\alpha$ and $\beta$ are set to $\alpha=1$ and $\beta=0$. Later, these values will be changed to derive the proper imbalance compensation.

The estimation of the imbalance caused by splitter 20 is described hereinafter. In accordance with one embodiment of the invention, it is assumed that both amplitude and phase imbalances are symmetric. This does not cause any loss of generality as for purposes of the present matter rather than their absolute values. To this end, $$\Delta_1 = \Delta_2 = \Delta = \frac{\Delta_{total}}{2} \qquad (14a)$$

and $$\phi_1 = \phi_2 = \phi = \frac{\phi_{total}}{2} \qquad (14b)$$

Equation (9) may be written as:

$$I'_2 = u_i = \frac{A}{4}[(1+\Delta)\cos(\theta-\phi)+(1-\Delta)\cos(\theta+\phi)] \qquad (15a)$$
$$= \frac{A}{2}[\cos(\phi)\cos(\theta)+\Delta\sin(\phi)\sin(\theta)]$$
$$\approx \frac{A}{2}\cos(\phi)\cos(\theta)$$

and $$Q'_2 = \frac{A}{4}(1+\Delta)\sin(\theta-\phi) + (1-\Delta)\sin(\theta+\phi)] = \frac{A}{2}[\Delta\sin(\theta)\cos(\theta) - \cos(\phi)\sin(\theta)] \quad (15b)$$

$$\approx -\frac{A}{2}\cos(\phi)\sin(\theta)$$

wherein-phase $I'_2$ and $Q'_2$ and quadrature phase signals for the desired signal at the output ports of filters 58 and 60, and $I'_{2\ image}$ and $Q'_{2\ image}$ are in-phase and quadrature phase signals for image signal at the output ports of filters 58 and 60. It is noted that the adders 52 and 54 are controlled by digital signal processor 56 so as to derive both desired and image signal components.

Using equations 15a through 15d the following set of equations are derived:

$$\frac{u'_1}{u_1} \approx \frac{\Delta\cos(\phi)\cos(\theta) + \sin(\phi)\sin(\theta)}{\cos(\phi)\cos(\theta)} = \Delta + \tan(\phi)\tan(\theta), \quad (16a)$$

$$\frac{u'_2}{u_3} \approx \frac{\sin(\phi)\cos(\theta) - \Delta\cos(\phi)\sin(\theta)}{-\cos(\phi)\sin(\theta)} = \Delta - \frac{\tan(\phi)}{\tan(\theta)} \quad (16b)$$

and $$\frac{u_1}{u_2} \approx \frac{\cos(\phi)\cos(\theta)}{\cos(\phi)\sin(\theta)} = \frac{-1}{\tan(\theta)} \quad (16c)$$

Equations 16a–16c can be written in terms of $\Delta$ and $\phi$ so that $$\phi = \arctan\left(\frac{u_1 u'_2 - u'_1 u_2}{u_1^2 + u_2^2}\right) \quad (17a)$$

and $$\Delta = \frac{u_1 u'_1 + u_2 u_2}{u_1^2 + u_2^2} \quad (17b)$$

It is noted that the imbalance errors will not change frequently in time. Furthermore, either one or both are dependent among other things on the frequency of the operation. In accordance with one embodiment of the invention, the imbalances defined by equations 17a and 17b are estimated for a number of frequency points and stored in digital signal processor 56, so as to derive compensation factors for various frequency operations.

In accordance with another embodiment of the invention, the required test-tone is generated by transceiver 10 itself. To this end switch 126 is coupled to the output port of low pass filter 122, during start up of the transceiver. The test tone is generated using the transmitting branch of transceiver 10 and is fed into mixers 22 and 24.

The generation of the test tone is accomplished by the I/Q modulator already present in the transmitting branch of transceiver 10, and is controlled by digital signal processor 56. As explained before, up conversion to radio frequency range is accomplished by the signal provided by local oscillator 118 via splitter unit 116.

In accordance with one embodiment of the invention, transceiver 10 employs the same local oscillator and phase splitter for both receive and transmit branches. To this end, the measured imbalance errors will not only represent the imbalances from the receiving branch, but also from the transmitting branch. For this reason, the method of imbalance measurement in accordance with this embodiment of the invention can only be applied if the imbalance errors are dominated by phase-splitter units. In that case it can be assumed that the measured imbalances are twice the actual values due to imbalance caused in the up-conversion transmitting branch and the imbalance caused in the down-conversion receiving branch.

Figure 4:
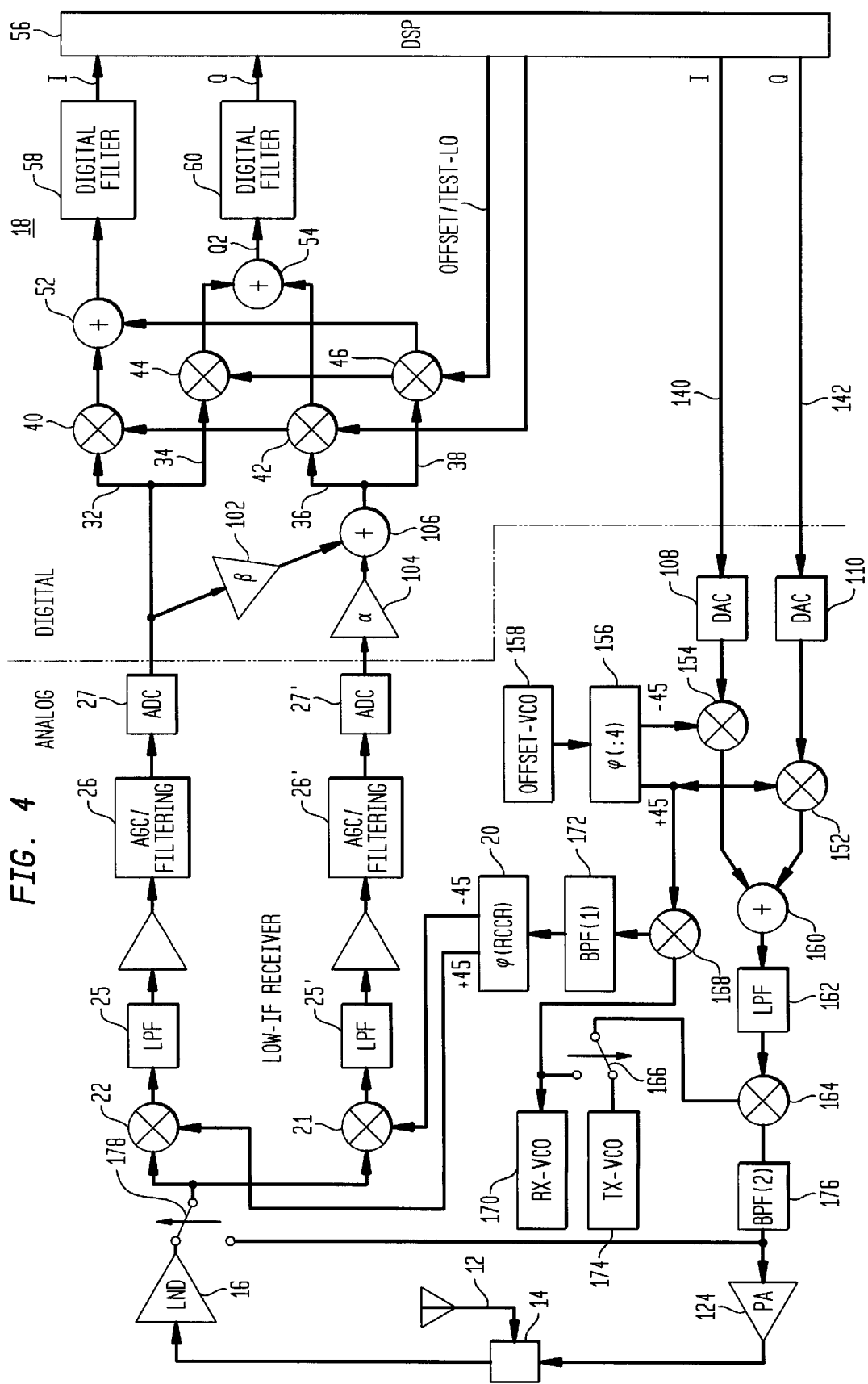

FIG. 4 illustrates a block diagram of a transceiver 10 in accordance with another embodiment of the invention. The transmitting branch of transceiver 10 of this embodiment converts baseband signals to radio-frequency range in two stages as will be explained in more detail hereinafter.

Thus, a local offset oscillator 158 generates a fixed sinusoidal signal referred to as offset local frequency. The output port of local offset oscillator 158 is coupled to a divide-by-four unit 156 which provides a signal which has a frequency equal to one fourth of the frequency of the signal generated by local offset oscillator 158. Divide-by-four unit 156 provides in-phase and quadrature phase signals to mixers 154 and 152 respectively so as to up convert the signals provided by digital-to-analog converters 108 and 110. The advantage of divide-by-four unit 156 over a splitter unit is that it is more accurate and causes far less imbalances. However, because the radio-frequency range of transceiver 10 could be relatively high, it is difficult to employ a local offset oscillator 158 that generates a frequency that is equal to four times the radio-frequency of transceiver 10. For this reason, transmitting branch of transceiver 10 converts the base band range signals to radio-frequency in two stages.

An output port of divide-by-four unit 156 is also coupled to an input port of a mixer 168. The other input port of mixer 168 is coupled to an output port of a receive oscillator 170. The frequency of receive oscillator 170 plus the frequency of the signal provided by divide-by-four unit 156 is equal to the frequency of the RF carrier frequency of signals received by transceiver 10. An output port of mixer 168 is coupled to splitter 20 via a band pass filter 172.

The output ports of mixers 154 and 152 are coupled to a band pass filter 162 via an adder 160. The output port of bandpass filter 162 is coupled to a second mixing stage 180 that includes a mixer 164. An input port of mixer 164 is coupled to a switch 166, which, when activated, is configured to receive a sinusoidal signal from a local transmit oscillator 174. The frequency of the signal generated by local transmit oscillator 174 plus the frequency of the signal provided by divide-by-four unit 156 is equal to the frequency of the RF carrier frequency of signals transmitted by transceiver 10. An output port of mixer 164 is coupled to a switch 178 via a bandpass filter 176.

It is noted that the second stage of two stage conversion to RF range in the transmit branch avoids the generation of a spurious signal in the image channel that would influence the imbalance measurements during calibration stage of transceiver 10. The first conversion stage employing the offset oscillator still causes imbalances. However, the quadrature local oscillator signals generated by divide-by-four unit 156 can provide an image rejection of 50 dB or better. It is noted that the invention is not limited in scope in that respect and any appropriate phase shifting circuit may be employed instead of divide-by-four unit 156 illustrated herein.

The estimated amplitude and phase imbalances during the calibration modes described in reference with FIGS. 2 and 4 above is described in more detail hereinafter. In accordance with one embodiment of the invention one way to compensate for the imbalances caused by splitter 20 is to adjust the components of the local oscillator based on measured amplitude and phase imbalances. However, in accordance with another embodiment of the invention, the imbalance errors are compensated by obtaining appropriate compensation factors α and β.

Figure 3:
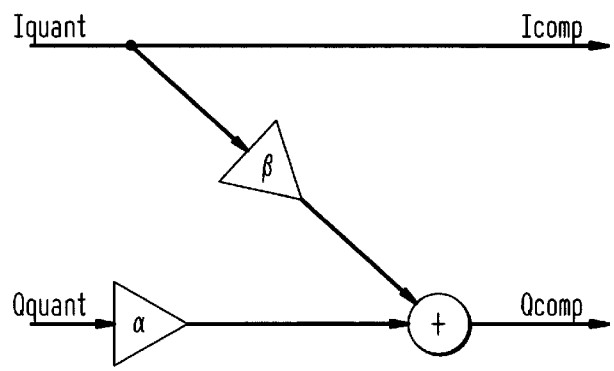
FIGS. 3–4 are a block diagrams of a receiver in accordance with other embodiments of the present invention.

As illustrated in FIG. 2, compensation factors affect the quadrature phase branch of IF mixing stage 28, although the invention is not limited in scope in that respect. FIG. 3 is a block diagram of the compensation unit of FIG. 2. The output signal of converter 28 is referred to as $I_{quant}$ and the output port of converter 28' is referred to as $Q_{quant}$. Similarly, the signal provided to branches 32 and 34 is referred to as $I_{comp}$ and the signal provided to branches 36 and 38 is referred to as $Q_{comp}$, so that $$I_{quant} = \frac{A}{2}\cos(\omega_d t + \theta) \tag{18a}$$

and $$Q_{quant} = -\frac{A}{2}(1 - \Delta_{total})\sin(\omega_d t + \theta + \phi_{total}) \tag{18b}$$

After compensation $$I_{quant} = \frac{A}{2}\cos(\omega_d t + \theta) \tag{19a}$$

and $$Q_{comp} = \frac{-A}{2}[\alpha\cos(\phi_{total})(1 - \Delta_{total})\sin(\omega_d t + \theta) + \{\alpha[(1 - \Delta_{total}\sin(\phi)] + \beta\}\cos(\omega_d t + \theta)] \tag{19b}$$

Thereafter the values of α and β are fixed, such that $$\alpha = \frac{1}{(1 - \Delta_{total})\cos(\phi_{total})} \tag{20a}$$

and $$\beta = -\tan(\phi_{total}) \tag{20b}$$

by employing the values of $\Delta_{total}$ and $\phi_{total}$ measured by following the procedures discussed in connection with equations 17a and 17b. Equations 19a and 19b then yield $$I_{comp} = \frac{A}{2}\cos(\omega_d t + \theta) \tag{21a}$$

and $$Q_{comp} = \frac{-A}{2}\sin(\omega_d t + \theta) \tag{21b}$$

Equations 21a and 21b illustrate the effect of compensation factors α and β which cause to compensate for the imbalances caused by splitter 20, in accordance with the present invention.

It is noted that some types of splitter units, such as RC-CR type splitters have frequency dependent amplitude imbalances. Although this dependence is predictable, it might be necessary to perform a number of measurements over the band to completely characterize the splitter. In such a case the value of a will also be frequency dependent.

In accordance with another embodiment of the invention, in order to overcome the need for trigonometric or square-root operations called for in equations 14 and 17 the compensation factors α and β may be derived as described hereinafter. As mentioned above, the equations for amplitude and phase imbalance are $$\phi_{total} = 2\arctan\left(\frac{u_1 u_2' - u_1' u_2}{u_1^2 + u_2^2}\right) \quad \Delta_{total} = 2 \cdot \left(\frac{u_1 u_1' + u_2 u_2'}{u_1^2 + u_2^2}\right)$$

Some intermediate variables are now defined as $$\text{denom} = u_1^2 + u_2^2 \tag{22a}$$

$$\text{amp\_imb} = (u_1 u_1' + u_2 u_2')/\text{denom} \tag{22b}$$

$$\text{tan\_phi} = (u_1 u_2' - u_1' u_2)/\text{denom} \tag{22c}$$

After realizing that:

$$\cos[2\arctan(x)] = 1 - 2\sin^2[\arctan(x)] = 1 - \frac{2x^2}{1 - (\tan\_phi)^2} \tag{22c'}$$

then $$\cos\_2\text{est} = 1 - \frac{2(\tan\_phi)^2}{1 - (\tan\_phi)^2}$$

Thus, α and β can be calculated by making use of the property that tan (2x)≈2 tan (x) for small values of x $$\alpha = [(1-\text{amp\_imb}) \cdot \cos\_2\text{est}]^{-1} \tag{23a}$$

$$\beta = -2 \tan\_phi \tag{23b}$$

which provide a way to calculate α and β compensation factors without applying trigonometric or square-root operations.

Referring now to FIGS. 5 through 9, the embodiments described above in reference with FIGS. 2 through 4 are implemented by a simulation program such as Matlab. In GSM-like applications the bit-rate is referred to as (rd) and is about 271 kbit/s. The initial sampling frequency is set to be 64 times as high as the GSM bit rate, i.e. 17.33 MHZ. Furthermore, local-oscillator 118 generates a carrier signal at 900 MHz, for up-conversion of an in base-band generated tone at 135.4 kHz (rd/2). This tone is injected in the receiving branch after low noise amplifier 16, via switch 126. The tone is then fed to the RF mixing stage 30 and I/Q down-converted (using again the 1900 kHz carrier) to the Low-IF frequency of 135.4 kHz. After filtering 5th order Butterworth at 190 kHz, via filter s 26 and 26', the high-frequency components are removed and the resulting signal (I/Q) is fed into a sigma/delta A/D converter 28 and 28'. This A/D converter has a straight forward second-order implementation. After performing a decimation filtering (sinc3) 58 and 60, the resulting signal is fed to IF mixing stage 28 and down sampled to a speed of 1083 kHz (I 3000/12=4 rd.

At this point I/Q imbalance compensation is performed. The second (quadrature) down conversion via IF mixing stages shifts the wanted signal (or image) to DC. The local oscillator frequency for digital mixers 40, 42, 44 and 46 is 135.4 kHz which is not equal to the second down conversion local oscillator frequency during normal operation. An FIR-filter (linear phase, 32 taps) filters out extra adjacent channel rejection by removing the remaining 2×135.4 kHz which is deemed as an interference to the angle/imbalance measurement intended to be performed. After the filter the computation described in the previous section is performed so as to obtain the estimated angle and imbalance data.

A single measurement consisted of processing a time span equal to 20 symbol periods which is approximately 74 $\mu s$. For the measurement of the values of $u_1, u_2, u_1'$ and $u_2'$, the group delay of the filters have to be taken into account. For these reason those values were obtained by averaging the signals represented by the equations (1–5) over the last 8 out of 20 symbol periods.

The performance of the imbalance measurement scheme in accordance with the present invention is described first. There are at least three variables that can be varied: $\phi$, $\Delta$ and $\theta$. In these simulations no distinction is made between $\phi_1/\phi_2$ and $\Delta_1/\Delta_2$. The difference between estimated phase/amplitude imbalance and the imbalances that were present in the simulations indicate the accuracy of the imbalance measurement scheme in accordance with the principles of the present invention.

Furthermore, the equivalent image rejection that would be obtained if it would be possible to completely compensate for the imbalances measured is described below. Equation (13) was used to calculate these numbers.

Figure 5:
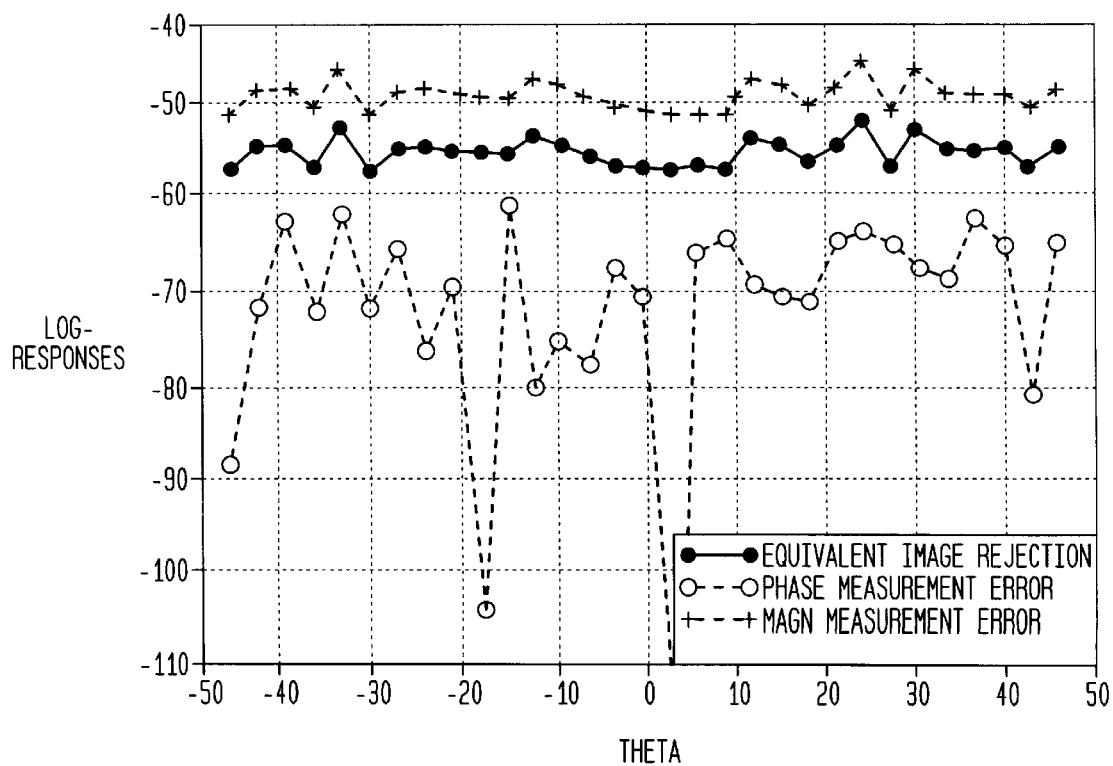

Thus, FIG. 5 gives the imbalance measurement errors as a function of $\theta$. In this simulation $\phi$ was equal to 7 degrees and $\Delta$ equal to 9%. The scale of the plot illustrated in FIG. 5 is logarithmic. The following formulas to convert the measurements were employed:

$$\text{phase\_error} = 20^{10} \log[\Delta_{error}] \quad (24)$$

$$\text{magn\_error} = 20^{10} \log[\phi_{error}] \quad (25)$$

$$\text{equiv. Image ref.} = 10^{10} \log[(\sin{}^2(\phi_{error}/2)^2 + \Delta_{error}/2)^2] \quad (26)$$

with $\Delta_{error}$ being the amplitude and $\phi_{error}$ being the phase imbalance measurement error. As illustrated on logarithmic scale, the equivalent image rejection varies between 50 and 60 dB as a function of $\theta$. In FIG. 6 $\theta$ is set to 30 degrees and $\Delta$ is set to 7%. Again as illustrated, the equivalent image rejection varies between 50 and 60 dB. This time by varying $\phi$ between −5 and +5 degrees.

The same result is achieved when varying $\Delta$ as illustrated in FIG. 7. This time $\theta$ is fixed to a value of 30 degrees and $\phi$ is equal to 7 degrees, and $\alpha$ varies between −10% and +10%.

It is noted that separately measuring the phase and amplitude imbalance works over a range of 50 dB. Further experiments show that the accuracy is limited by the A/D converters. This is a valid conclusion as an image rejection of 50 dB for a 16 times oversampled $2^{nd}$ order Sigma/Delta converter is substantially the limit of rejection that can be achieved. It is noted that the accuracy limitation by the A/D converter is not concerning as it not necessary to measure an image signal if it is so small that it can not be seen as causing interference to the wanted signal.

$$\text{image rej.} = 10^{10} \log \left[ \frac{u_1'^2 + u_2'^2}{u_1^2 + u_2^2} \right] \quad (27)$$

The results of the compensation scheme in accordance with the principles of the present invention is described hereinafter. Every simulation was performed twice: the first pass calculating the image-rejection without compensation and determining the values of $\alpha$ and $\beta$. In the second pass these values were applied and the resulting image-rejection was measured as:

To also incorporate the random nature of $\theta$, this parameter was implemented as uniformly distributed in [0, 2 $\pi$]. Both passes of a simulation run used different (random) values of $\theta$. Simulation results are illustrated in the FIGS. 7 and 8, for varying $\phi_1$ and $\Delta_1$ respectively. In these simulations a distinction was made between $\phi_1/\phi_2$ and $\Delta_1/\Delta_2$. Default values were for $\phi_1$ and $\phi_2$, 4 and 3 degrees respectively and for $\Delta_1$ and $\Delta_2$, 7% and 2% respectively.

From the plots it can be seen that the compensation scheme works as expected: the resulting image rejection after compensation is about 50 dB.

While only certain features of the invention have been illustrated and described herein, many modifications, substitutions, changes or equivalents will now occur to those skilled in the art. It is therefore, to be understood that the appended claims are intended to cover all such modifications and changes that fall within the true spirit of the invention.

I claim:

1. In a communications terminal having an image reject mixing arrangement a compensation system for providing compensation for phase and amplitude imbalances caused by a demodulating local oscillator employed in the communications terminal, said compensation system comprising:

a radio-frequency (RF) mixing stage including an in-phase and a quadrature phase branch, configured to receive a radio frequency signal and down convert said radio frequency signal to in-phase and quadrature phase intermediate frequency (IF) signals;

a phase splitter unit coupled to said radio-frequency (RF) mixing stage and configured to provide an in-phase local oscillator signal and a quadrature phase local oscillator signal to said RF mixing stage, said phase splitter causing an amplitude imbalance signal $\Delta$ and a phase imbalance signal $\phi$ to be generated in said in-phase and quadrature phase branch of said RF mixing stage;

a processing circuit coupled to said RF mixing stage and configured to measure a first value associated with said amplitude imbalance and a second value associated with said phase imbalance;

a phase splitter compensation unit coupled to said RF mixing stage and configured to multiply said in-phase and quadrature phase signals provided by said RF mixing stage by a predetermined compensation factor associated with said measured first and second values; and an intermediate frequency (IF) mixing stage coupled to said radio-frequency mixing stage via said phase splitter compensation unit, said IF mixing stage configured to convert said intermediate signals received from said RF mixing stage to base band frequency region.

2. The communications terminal in accordance with claim 1, further comprising a switching unit coupled to said RF mixing stage and configured to receive a test tone signal and provide said test tone signal to said RF mixing stage.

3. The communications terminal in accordance with claim 2, further comprising a signal processing unit coupled to said IF mixing stage and configured to measure in-phase and quadrature phase components of test tone signal and an image signal caused by said amplitude imbalance $\Delta$ and phase imbalance $\phi$.

4. The communication terminal in accordance with claim 3, wherein said signal processing unit provides said compensation factors to said compensation unit based on measurements made in response to said test tone signal.

5. The communication terminal in accordance with claim 3, wherein each of said in-phase and quadrature phase branches of said RF mixing stage further comprises:

a mixer configured to receive radio-frequency signals, and a corresponding in-phase and quadrature phase local oscillator signal to convert said radio-frequency signal to an intermediate frequency (IF) region signal;

a low-pass filter coupled to said mixer; and an analog-to-digital converter coupled to said low-pass filter.

6. The communication terminal in accordance with claim 3, wherein said in-phase branches of said IF mixing stage further comprises:

a first and a second mixer configured to receive signals provided by said RF mixing stage so as to mix said in-phase signal of said RF mixing stage with an in-phase and quadrature phase local IF oscillator signal; and a third and a fourth mixer configured to receive said quadrature phase signal of said RF mixing stage so as to mix said quadrature phase signal of said RF mixing stage with an in-phase and quadrature phase local IF oscillator signal.

7. A communication terminal in accordance with claim 6 further comprising:

a first adder configured to receive signals provided by said first and fourth mixer of said IF mixing stage, said first adder providing a signal to said signal processing unit via a digital filter; and a second adder configured to receive signals provided by said second and third mixer of said IF mixing stage, said second adder providing a signal to said signal processing unit via digital filter.

8. A communication terminal in accordance with claim 7 wherein said compensation unit comprises:

a first multiplier coupled to an output port of said in-phase branch of said RF mixing stage so as to provide a compensation factor $\beta$;

a second multiplier coupled to an output port of said quadrature phase branch of said RF mixing stage so as to provide a compensation factor $\alpha$; and an adder coupled to said first and second multiplier so as to provide a compensation signal to said quadrature branch of said IF mixing stage.

9. A communication terminal in accordance with claim 8 wherein said compensation factor $\alpha$ and $\beta$ is calculated based on $$\alpha = \frac{1}{(1-\Delta_{total})\cos(\phi_{total})}$$

$$\beta = -\tan(\phi_{total}).$$

10. A communication terminal in accordance with claim 8 wherein said compensation factors $\alpha$ and $\beta$ is derived as $$\alpha = [(1-\text{amp\_imb}) \cdot \cos\_2\text{est}]^{-1}$$

$$\beta = -2 \tan\_\text{phi}$$

wherein $$\text{amp\_imb} = (u_1 u'_1 + u_2 u'_2)/\text{denom}$$

$$\tan\_\text{phi} = (u_1 u'_2 - u'_2 u_2)/\text{denom},$$

and $$\cos\_2\text{est} = 1 - \frac{2(\tan\_\text{phi})^2}{1-(\tan\_\text{phi})^2}$$

wherein $u_1$ and $u_2$ are respectively in-phase and quadrature phase signals of said test tone signal and $u'_1$ and $u'_2$ are respectively in-phase and quadrature phase signals of said image signal.

11. In a communications terminal having an image reject mixing arrangement a compensation system for providing compensation for phase and amplitude imbalances caused by a demodulating local oscillator employed in the communications terminal, said compensation system comprising:

a radio-frequency (RF) mixing stage including an in-phase and a quadrature phase branch, configured to receive a radio frequency signal and down convert said radio frequency signal to in-phase and quadrature phase intermediate frequency (IF) signals;

a phase splitter unit coupled to said radio-frequency (RF) mixing stage and configured to provide an in-phase local oscillator signal and a quadrature phase local oscillator signal to said RF mixing stage, said phase splitter causing an amplitude imbalance signal $\Delta$ and a phase imbalance signal $\phi$ to be generated in said in-phase and quadrature phase branch of said RF mixing stage;

a processing circuit coupled to said RF mixing stage and configured to measure a first value associated with said amplitude imbalance and a second value associated with said phase imbalance;

a phase splitter compensation unit coupled to said RF mixing stage and configured to multiply said in-phase and quadrature phase signals provided by said RF mixing stage by a predetermined compensation factor associated with said measured first and second values:

an intermediate frequency (IF) mixing stage coupled to said radio-frequency mixing stage via said phase splitter compensation unit, said IF mixing stage configured to convert said intermediate signals received from said RF mixing stage to base band frequency region; and a transmitter stage coupled to said RF mixing stage and configured to provide a test tone signal to said RF mixing stage.

12. The communications terminal in accordance with claim 11, wherein said transmitter stage further comprises:

a first transmission mixing stage having a first and a second transmission mixer configured to mix a base band test tone signal with a signal generated by an offset local oscillator; and a second transmission mixing stage coupled to said first transmission mixing stage, for mixing the signal provided by said first transmission mixing stage with a signal generated by a transmission local oscillator.

13. The communications terminal in accordance with claim 12 further comprising a phase splitter coupled to said offset local oscillator for providing an in-phase and a quadrature phase mixing signal to said first and second transmission mixers.

14. The communications terminal in accordance with claim 13, wherein said phase splitter is a divide-by-four unit.

15. The communications terminal in accordance with claim 14, further comprising a switching unit coupled to said RF mixing stage and configured to receive said test tone signal and provide said test tone signal to said RF mixing stage.

16. The communications terminal in accordance with claim 15, further comprising a signal processing unit coupled to said IF mixing stage and configured to measure in-phase and quadrature phase components of test tone signal and an image signal caused by said amplitude imbalance $\Delta$ and phase imbalance $\phi$.

17. The communication terminal in accordance with claim 16, wherein said signal processing unit provides said compensation factors to said compensation unit based on measurements made in response to said test tone signal.

18. The communication terminal in accordance with claim 16, wherein each of said in-phase and quadrature phase branches of said RF mixing stage further comprises:
   a mixer configured to receive radio-frequency signals, and a corresponding in-phase and quadrature phase local oscillator signal to convert said radio-frequency signal to an intermediate frequency (IF) region signal;
   a low-pass filter coupled to said mixer; and
   an analog-to-digital converter coupled to said low-pass filter.

19. The communication terminal in accordance with claim 18, wherein said in-phase branches of said IF mixing stage further comprises:
   a first and a second mixer configured to receive signals provided by said RF mixing stage so as to mix said in-phase signal of said RF mixing stage with an in-phase and quadrature phase local IF oscillator signal; and
   a third and a fourth mixer configured to receive said quadrature phase signal of said RF mixing stage so as to mix said quadrature phase signal of said RF mixing stage with an in-phase and quadrature phase local IF oscillator signal.

20. A communication terminal in accordance with claim 19 further comprising:
   a first adder configured to receive signals provided by said first and fourth mixer of said IF mixing stage, said first adder providing a signal to said signal processing unit via digital filter; and
   a second adder configured to receive signals provided by said second and third mixer of said IF mixing stage, said second adder providing a signal to said signal processing unit via digital filter.

21. A communication terminal in accordance with claim 20 wherein said compensation unit comprises:
   a first multiplier coupled to an output port of said in-phase branch of said RF mixing stage so as to provide a compensation factor $\beta$;
   a second multiplier coupled to an output port of said quadrature phase branch of said RF mixing stage so as to provide a compensation factor $\alpha$; and
   an adder coupled to said first and second multiplier so as to provide a compensation signal to said quadrature branch of said IF mixing stage.

22. A communication terminal in accordance with claim 21 wherein said compensation factor $\alpha$ and $\beta$ is calculated based on $$\alpha = \frac{1}{(1 - \Delta_{total})\cos(\phi_{total})}$$

$$\beta = -\tan(\phi_{total}).$$

23. A communication terminal in accordance with claim 21 wherein said compensation factors $\alpha$ and $\beta$ is derived as $$\alpha = [(1-\text{amp\_imb}) \cdot \cos\_2\text{est}]^{-1}$$

$$\beta = -2 \tan\_\text{phi}$$

wherein $$\text{amp\_imb} = (u_1 u'_1 + u_2 u'_2)/\text{denom}$$

$$\tan\_\text{phi} = (u_1 u'_2 - u'_2 u_2)/\text{denom},$$

and $$\cos\_2\text{est} = 1 - \frac{2(\tan\_\text{phi})^2}{1 - (\tan\_\text{phi})^2}$$

wherein u1 and u2 are respectively in-phase and quadrature phase signals of said test tone signal and u'1 and u'2 are respectively in-phase and quadrature phase signals of said image signal.

24. In a communications terminal employing an image-rejection system a method for compensating image signals caused by local oscillator of said communications terminal comprising the steps of:
   receiving a radio frequency signal and down converting said radio frequency signal in a radio-frequency (RF) mixing stage so as to provide in-phase and quadrature phase intermediate frequency (IF) signals;
   providing an in-phase local oscillator signal and a quadrature phase local oscillator signal to said RF mixing stage via a phase splitter that causes said image signals that are compensated, said phase splitter causing an amplitude imbalance signal $\Delta$ and a phase imbalance signal $\phi$;
   measuring, via a processing circuit coupled to said RF mixing stage, a first value associated with said amplitude imbalance and a second value associated with said phase imbalance;
   multiplying said in-phase and quadrature phase signals provided by said RF mixing stage by a predetermined compensation factor associated with said measured first and second values; and
   converting said intermediate signals received from said RF mixing stage to base band frequency region via an intermediate frequency (IF) mixing stage coupled to said radio-frequency mixing stage.

25. The method in accordance with claim 24, further comprising the step of receiving a test tone signal and providing said test tone signal to said RF mixing stage.

26. The method in accordance with claim 25, further comprising the step of measuring in-phase and quadrature phase components of said test tone signal and an image signal caused by said amplitude imbalance $\Delta$ and phase imbalance $\phi$.

27. The method in accordance with claim 26, further comprising the step of providing said compensation factors to said compensation unit based on measurements made in response to said test tone signal.

28. The method in accordance with claim 27, wherein said step of multiplying further comprises the step of calculating a first and a second compensation factor $\alpha$ and $\beta$ based on $$\alpha = \frac{1}{(1 - \Delta_{total})\cos(\phi_{total})}$$

$$\beta = -\tan(\phi_{total}).$$

29. The method in accordance with claim 27 wherein said step of multiplying further comprises the step of calculating a first and a second compensation factor $\alpha$ and $\beta$ based on $$\alpha = [(1-\text{amp\_imb}) \cdot \text{cos\_2est}]^{-1}$$

$$\beta = -2\,\text{tan\_phi}$$

wherein $$\text{amp\_imb} = (u_1 u'_1 + u_2 u'_2)/\text{denom}$$

$$\text{tan\_phi} = (u_1 u'_2 - u'_2 u_2)/\text{denom},$$

and $$\text{cos\_2est} = 1 - \frac{2(\tan\_\text{phi})^2}{1-(\tan\_\text{phi})^2}$$

wherein u1 and u2 are respectively in-phase and quadrature phase signals of said test tone signal and u'1 and u'2 are respectively in-phase and quadrature phase signals of said image signal.

* * * * *